United States Patent [19]

Brown

[11] 4,363,077

[45] Dec. 7, 1982

[54] ROTARY CIRCUIT COMPONENT ASSEMBLY AND CIRCUIT MOUNTING

[75] Inventor: Robert E. Brown, Lynchburg, Va.

[73] Assignee: General Electric Company, Lynchburg, Va.

[21] Appl. No.: 244,304

[22] Filed: Mar. 16, 1981

[51] Int. Cl.³ .................... H05K 7/02; H01H 21/00
[52] U.S. Cl. ............................. 361/400; 200/11 R; 361/408
[58] Field of Search ............ 200/11 R, 11 D, 11 DA, 200/14, 292, 294; 339/17 C, 17 L, 17 LC, 17 LM, 17 N; 361/399, 400, 405, 406, 404, 408, 417

[56] References Cited

U.S. PATENT DOCUMENTS

| | | | |
|---|---|---|---|
| 2,796,499 | 6/1957 | Barden et al. | 200/11 DA |
| 2,971,066 | 2/1961 | Tabet | 200/14 X |
| 2,988,607 | 6/1961 | Tabet | 200/14 X |
| 3,142,784 | 7/1964 | Bloomfield | 335/84 |
| 3,248,490 | 4/1966 | Allison | 200/14 |
| 3,271,627 | 9/1966 | McDougal | 361/408 |
| 3,681,555 | 8/1972 | Ohkita | 200/292 X |
| 3,780,238 | 12/1973 | Brant et al. | 200/14 X |
| 4,032,730 | 6/1977 | Golbeck et al. | 200/14 X |

Primary Examiner—J. R. Scott
Attorney, Agent, or Firm—James J. Williams

[57] ABSTRACT

A rotary circuit component with a rotatable shaft is secured to a mounting structure so that rotary motion of the shaft and axial motion along the shaft are prevented in part by a mating slot and notch, fastening means, and terminal tabs on the component soldered to slits in a printed circuit board.

6 Claims, 7 Drawing Figures

ROTARY CIRCUIT COMPONENT ASSEMBLY AND CIRCUIT MOUNTING

BACKGROUND OF THE INVENTION

My invention relates to rotary circuit components with a rotatable shaft for varying the electrical characteristics of the component, such as a contact position or electrical property of the component. My invention relates particularly to the mounting of the rotary circuit components into a circuit assembly.

Rotary circuit components such as switches, trimming capacitors, rheostats and potentiometers are conventionally mounted with a threaded bushing which is positioned in a hole in a bracket, printed circuit board, or the like, and which is held by a nut and lockwasher. A mating projection and keyway are often required to prevent the entire component from rotating. This conventional approach is not cost effective from either an initial assembly or replacement standpoint.

There is an obvious need to be able to quickly and efficiently insert and hold a rotary circuit component on a product during manufacture. The prior art does not address this need satisfactorily.

OBJECTS AND SUMMARY OF THE INVENTION

An object of the invention is to provide a rotary circuit component assembly which satisfactorily addresses the need noted above and which firmly, easily and effectively secures the rotary circuit component during manufacture.

A primary object of the invention is to provide a new and improved rotary circuit component assembly that secures the rotary circuit component against undesired rotation.

A related object of the invention is to provide a rotary circuit component assembly in which part of the rotary circuit component is modified to permit the rotary circuit component to be easily and securely mounted against undesired rotation and axial movement.

Another object of the invention is to provide a rotary circuit component assembly with the above advantages that is inexpensive to produce and replace.

The invention achieves these and other objects with a rotary circuit component with a plain or unthreaded bushing having two or three right angle grooves or kerfs which fit the edges forming an open slot in a bracket or printed circuit board. These mating grooves and edges provide resistance against rotation of the entire rotary circuit component. The assembled component is further held against rotation by tabs on the component which are soldered on runs or in slits of a larger printed circuit board. These soldered tabs also provide electrical connections. The bracket may be similarly held on the larger board by tabs soldered in slits of the larger board.

BRIEF DESCRIPTION OF THE DRAWING

The subject matter which I regard as my invention is particularly pointed out and distinctly claimed in the claims. The structure and operation of my invention, together with further objects and advantages, may be better understood from the following description given in connection with the accompanying drawing, in which:

DETAILED DESCRIPTION OF THE PREFERRED EMBODIMENT

Figure 1:
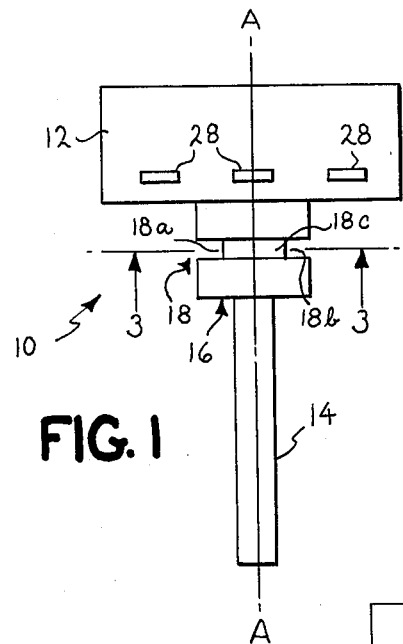
FIG. 1 shows a bottom view of a rotary circuit component with a slotted bushing in accordance with my invention.
Figure 2:
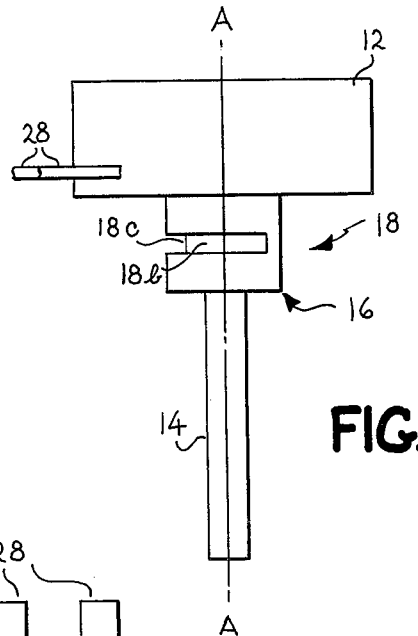
FIG. 2 shows a side view of the rotary circuit component of FIG. 1.
Figure 3:
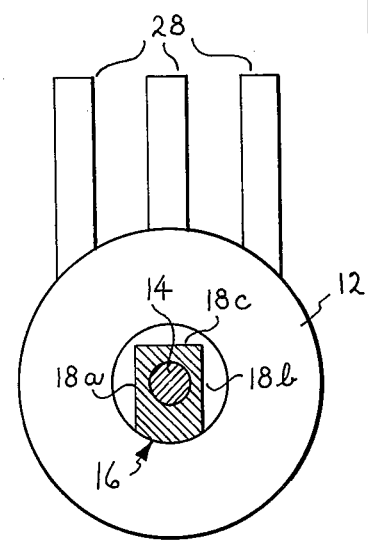
FIG. 3 shows a cross-sectional view of the shaft and bushing, taken along line 3—3 of FIG. 1.

FIGS. 1-3 show a rotary circuit component 10 such as a rotary switch, a trimming capacitor, a rheostat, a potentiometer, or the like in accordance with my invention. The rotary circuit component 10 (hereinafter component 10) includes a body 12 which houses the elements (not shown) which determine the characteristic, such as the contact position or electrical property, of the component 10. Extending from the body 12 is a shaft 14 which is rotatably mounted on the body 12. Typically, a knob (not shown) is mounted on the shaft 10. When the shaft 14 is rotated, it varies the characteristic of the component 10. Coaxial to and surrounding the shaft 14 is a plain hollow cylinder or bushing 16. As used herein, hollow is intended to mean a space that receives and rotatably supports the shaft 14. This bushing 16 is secured to the body 12 and acts as a rotary support and guide for the shaft 14. Aside from the bushing 16 being unthreaded, the component 10 is standard and not significantly unlike most known components of its category. One or more connecting terminals or tabs 28 are provided to connect the component 10 to an external circuit.

In accordance with my invention, a recessed slot (or groove or kerf) 18 is formed in the outer surface of the bushing 16 as shown in FIGS. 1-3. The slot 18 preferably includes three straight portions 18a, 18b, 18c respectively joined at right angles so that the portions 18a, 18b are parallel, and the portion 18c is perpendicular to the portions 18a, 18b. The exact location of the slot 18 on the bushing 16 along the axis A—A and the dimensions and shape of its portions 18a, 18b, 18c can be whatever the circuit assembly design considerations dictate. It is only necessary that a compatibility exist between the slot 18 and a corresponding notch 24 in a mounting structure 22 (bracket or printed circuit board) shown in FIG. 4 to which the component 10 is to be mounted to form the rotary circuit component assembly. That is, the slot 18 and notch 24 should be dimensionally compatible and fit together, so that when the component 10 is mounted on the mounting structure 22, axial and rotational movement of the component 10 with respect to its axis A—A is prevented.

Figure 4:
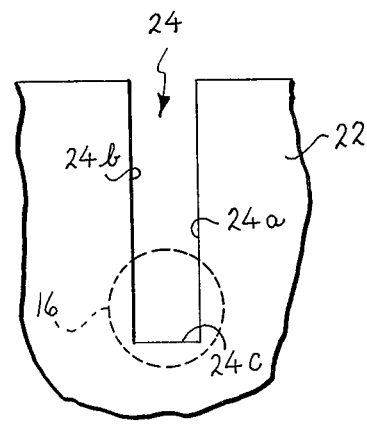
FIG. 4 shows a notched bracket or printed circuit board for receiving the rotary circuit component of FIGS. 1-3.

With reference to FIG. 4, the structure 22 may be a bracket or printed circuit board. The structure 22 includes an open-ended notch 24 which is compatible with the slot 18. The notch 24 has three straight edges 24a, 24b, 24c which are dimensioned and oriented to mate with or fit into the portions 18a, 18b, 18c respectively when the component 10 is placed on the structure 22. This means that the thickness of the structure 22 should be slightly less than the dimension of the slot 18 along the axis A—A, and that the distance between the edges 24a, 24b should be slightly more than the distance between the portions 18a, 18b. Also, the edges 24a, 24b are preferably parallel, and the edge 24c is perpendicular to the edges 24a, 24b. With these configurations, the slot 18 will engage the notch 24 in a snug manner, when the bushing 16 (indicated by the dashed line) is positioned on the structure 22.

Figure 5:
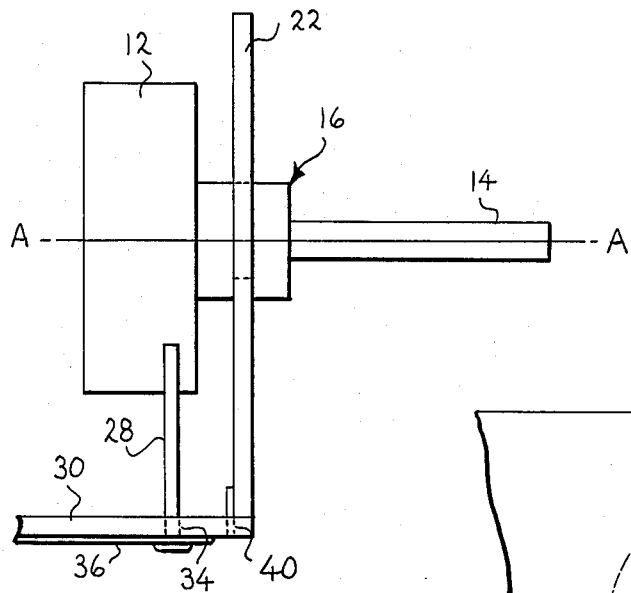
FIG. 5 shows a side elevational view of a circuit assembly in accordance with my invention.
Figure 6:
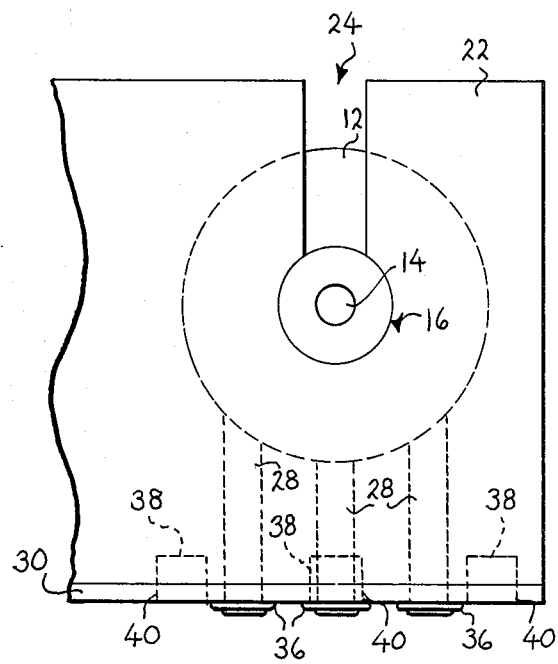
FIG. 6 shows a front elevational view of the circuit assembly of FIG. 5.

The compatibility of the slot 18 and the notch 24 insures that the component 10 can be easily mounted on and removed from the structure 22, and will be firmly secured thereto to form the rotary circuit component assembly. As shown in FIGS. 5 and 6, the component 10 is mounted on the structure or bracket 22 by aligning the slot 18 with the notch 24, and dropping the component 10 into place. Once in place, the slot portions 18a, 18b, 18c are in firm engagement with the edges 24a, 24b, 24c and can not move along the axis A—A, and can not rotate, despite considerable torque applied to the shaft 14 or bushing 16.

As also shown in FIGS. 5 and 6, additional resistance to rotation is provided by attaching or soldering the terminals or tabs 28 of the component 10 to a larger printed circuit board or mother board 30 on which the assembly is mounted. The terminals or tabs 28 extend through slits 34 in the mother board 30 and are then soldered or suitably fastened (as by bending or flaring) to appropriate electrical connections or copper runs 36 on either or both sides of the mother board 30. When soldering is used, capillary action draws the solder into the slits 34 to insure a strong joint which provides resistance to rotation. In addition, movement of the component 10 normal to its axis A—A is also prevented by the strong solder joint.

Figure 7:
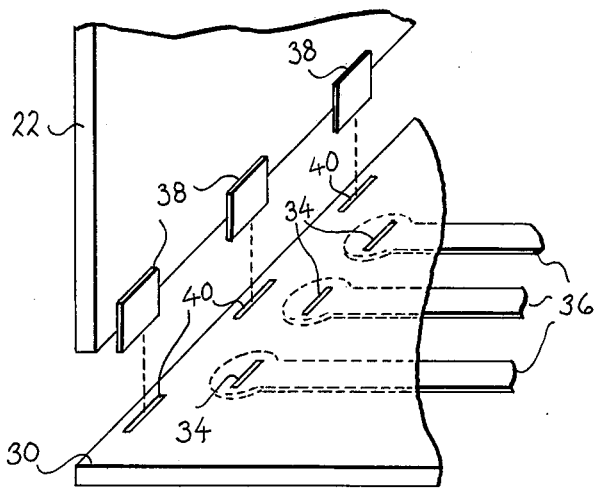
FIG. 7 shows details of joining the bracket or printed circuit board to the printed circuit board of the circuit assembly.

The structure 22 can be attached to the mother board 30 in the manner illustrated in FIGS. 5-7. The structure 22 is provided with tabs 38 which extend into slits 40 provided in the mother board 30. The tabs 38 engage the slots 40 with a tight fit, and can be soldered or mechanically fastened. Alternatively, the structure 22 and the mother board 30 can be fastened together by an angle bracket, or a slot may be provided in the mother board 30 to receive the structure 22. In any case, the terminal or tabs 28 are fastened as described above.

According to a variant of the invention, the slot 18 may have only one portion (such as 18a), or two portions (such as 18a, 18c) and still provide fairly good mounting and resistance to rotation.

The invention disclosed and illustrated by reference to the preferred embodiments provides a new assembly for a rotary circuit component. With the invention, a component can be quickly and efficiently inserted, secured and locked into an assembly, and quickly and efficiently mounted into a larger circuit assembly. This advantage is enhanced by the fact that the component can be just as easily removed for replacement. The invention, moveover, is ideally suited for those applications where space requirements are a factor. While the invention has been described with reference to particular embodiments, it is to be understood that modifications may be made without departing from the spirit of the invention or from the scope of the claims.

What I claim as new and desire to secure by Letters Patent of the United States is:

1. A rotary circuit component assembly in which the rotary circuit component is secured and locked in position, comprising:
  a. a rotary circuit component including:
    1. a body which houses the component elements that determine the characteristics of said component;
    2. a shaft defining a rotational axis of said rotary circuit component, and rotatably mounted to said body to engage said elements in said body for the purpose of altering the characteristics of said component; and
    3. a cylindrical bushing positioned around said shaft and attached to said body, said cylindrical bushing having a slot defined therein;
  b. a mounting structure including a notch which is dimensionally compatible with said slot, for receiving said cylindrical bushing at said slot such that said slot and notch are aligned; and
  c. fastening means for securing and locking said rotary circuit to a circuit board having slits therein.

2. The rotary circuit component assembly as defined in claim 1, wherein said slot is defined by three portions recessed with respect to the outer surface of said cylindrical bushing, and wherein said notch is open-ended and has three edges which are oriented and dimensioned to correspond with respective ones of said three portions defining said slot.

3. The rotary circuit component assembly as defined in claim 2 wherein two of said slot portions are substantially parallel and wherein the third of said slot portions is substantially perpendicular to said two slot portions.

4. Thr rotary circuit component assembly as defined in claims 1 or 2 or 3 wherein said fastening means comprise a plurality of tabs for connecting said rotary circuit component assembly to said circuit board.

5. The circuit component assembly as defined in claim 4 wherein said tabs engage respective slits in said circuit board for soldering thereto.

6. The circuit component assembly as defined in claim 5 wherein said mounting structure includes a plurality of tabs for engaging respective slits in said circuit board for soldering hereto.

* * * * *

UNITED STATES PATENT OFFICE
CERTIFICATE OF CORRECTION

Patent No. 4,363,077      Dated December 7, 1982

Inventor(s) Robert E. Brown

It is certified that error appears in the above-identified patent and that said Letters Patent are hereby corrected as shown below:

Col. 4, line 33, after "circuit" (first occurrence), insert -- component --

Col. 4, line 45, cancel "Thr" and insert -- The --

Signed and Sealed this

Twenty-second Day of March 1983

[SEAL]

Attest:

GERALD J. MOSSINGHOFF

Attesting Officer      Commissioner of Patents and Trademarks